(12) United States Patent
Watanabe

(10) Patent No.: US 12,395,132 B2
(45) Date of Patent: Aug. 19, 2025

(54) WIRELESS COMMUNICATION CIRCUIT

(71) Applicant: Socionext Inc., Kanagawa (JP)

(72) Inventor: Takeaki Watanabe, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 337 days.

(21) Appl. No.: 18/330,019

(22) Filed: Jun. 6, 2023

(65) Prior Publication Data

US 2023/0327613 A1    Oct. 12, 2023

Related U.S. Application Data

(63) Continuation of application No. PCT/JP2021/005944, filed on Feb. 17, 2021.

(51) Int. Cl.
*H03F 3/00* (2006.01)
*H03F 1/56* (2006.01)
*H03F 3/19* (2006.01)

(52) U.S. Cl.
CPC ............... *H03F 1/565* (2013.01); *H03F 3/19* (2013.01); *H03F 2200/294* (2013.01); *H03F 2200/451* (2013.01)

(58) Field of Classification Search
CPC ...... H03F 1/565; H03F 3/19; H03F 2200/294; H03F 2200/451; H03F 2200/213; H03F 2200/42; H03F 3/195; H04B 1/525
See application file for complete search history.

(56) References Cited

U.S. PATENT DOCUMENTS

| 2007/0103248 | A1* | 5/2007 | Nakamura | H03D 3/007 331/167 |
| 2008/0231369 | A1 | 9/2008 | Kim et al. | |
| 2014/0300417 | A1 | 10/2014 | Xu et al. | |
| 2015/0038093 | A1 | 2/2015 | Connell et al. | |
| 2016/0036392 | A1* | 2/2016 | Bohsali | H03F 3/72 330/296 |
| 2016/0336983 | A1 | 11/2016 | Wang et al. | |
| 2016/0337152 | A1 | 11/2016 | Masui et al. | |

(Continued)

FOREIGN PATENT DOCUMENTS

| JP | 2008-072475 A | 3/2008 |
| JP | 2016-514926 A | 5/2016 |
| JP | 2018-088707 A | 6/2018 |

(Continued)

OTHER PUBLICATIONS

International Search Report (ISR) dated Apr. 13, 2021 issued in International Patent Application No. PCT/JP2021/005944, with English translation.

*Primary Examiner* — Ping Y Hsieh
(74) *Attorney, Agent, or Firm* — Rimon P.C.

(57) ABSTRACT

A wireless communication circuit includes: an antenna; a transmitter circuit having an output amplifier outputting a transmission signal to the antenna; a receiver circuit having an LNA into which a reception signal from the antenna is input; and a matching circuit provided between the antenna and the input of the LNA. The LNA has a MOS input transistor receiving at its gate the reception signal from the antenna via the matching circuit, and includes a variable capacitance provided between the gate and source of the input transistor, the capacitance value of the variable capacitance being changed between the transmission time and the reception time.

4 Claims, 4 Drawing Sheets

(56) References Cited

U.S. PATENT DOCUMENTS

2018/0062599 A1* 3/2018 Lee .................. H03F 1/223
2019/0089390 A1   3/2019 Ta et al.

FOREIGN PATENT DOCUMENTS

| JP | 2018-518889 A | 7/2018 |
| JP | 2019-057758 A | 4/2019 |
| WO | 2015/114836 A1 | 8/2015 |

* cited by examiner

WIRELESS COMMUNICATION CIRCUIT

CROSS-REFERENCE TO RELATED APPLICATIONS

This is a continuation of International Application No. PCT/JP2021/005944 filed on Feb. 17, 2021. The entire disclosure of this application is incorporated by reference herein.

BACKGROUND

The present disclosure relates to a wireless communication circuit using a CMOS process.

There are needs for using CMOS processes in wireless communication circuits from the standpoint of cost advantage. In a wireless communication circuit, when a transmitter circuit and a receiver circuit are connected to an antenna, a loss occurs due to a signal leakage from the transmitter circuit to the receiver circuit during transmission. In particular, when a CMOS process is used, the parasitic capacitance of a low noise amplifier (LNA) provided in the receiver circuit tends to be large, and this increases the loss. To prevent this, an antenna switch may be provided between the transmitter circuit and the receiver circuit. This however increases the number of circuit elements, thereby increasing the cost.

To address the above problem, Japanese Unexamined Patent Publication No. 2008-72475 discloses a technique using a 214 strip line and a switching diode in which the switching diode is controlled to be ON during signal transmission to give high impedance on the receiver side, thereby preventing or reducing attenuation of the transmission output.

In the cited Patent Document, while the loss from the transmitter circuit to the receiver circuit is prevented or reduced with no antenna switch provided, there is a problem that the cost for providing the strip line increases. For example, in transmission of a signal of 1 [GHz] on a printed board having a relative dielectric constant of 4.9, a transmission line of about 3.4 [cm] is necessary, which increases the board size.

An objective of the present disclosure is providing a wireless communication circuit capable of preventing or reducing attenuation of a transmission signal and a reception signal with no switch or strip line provided.

SUMMARY

According to one mode of the present disclosure, a wireless communication circuit includes: an antenna; a transmitter circuit having an output amplifier outputting a transmission signal to the antenna; a receiver circuit having a low noise amplifier (LNA) into which a reception signal from the antenna is input; and a matching circuit provided between the antenna and an input of the LNA, wherein the LNA has a MOS input transistor receiving at its gate the reception signal from the antenna via the matching circuit, and the LNA includes a variable capacitance provided between the gate and a source of the input transistor, a capacitance value of the variable capacitance being changed between a transmission time during which the transmission signal is output and a reception time during which the reception signal is received.

According to the present disclosure, by providing a variable capacitance having a capacitance value changed between the transmission time and the reception time on the receiver circuit side, attenuation of a transmission signal and a reception signal can be prevented or reduced with a smaller number of circuit elements than in the case of providing a switch or a strip line.

DETAILED DESCRIPTION

Embodiments of the present disclosure will be described hereinafter. It is to be noted that specific numerical values presented in the following embodiments are merely illustrative for easy understanding of the invention and by no means intended to limit the scope of the invention.

Figure 1:
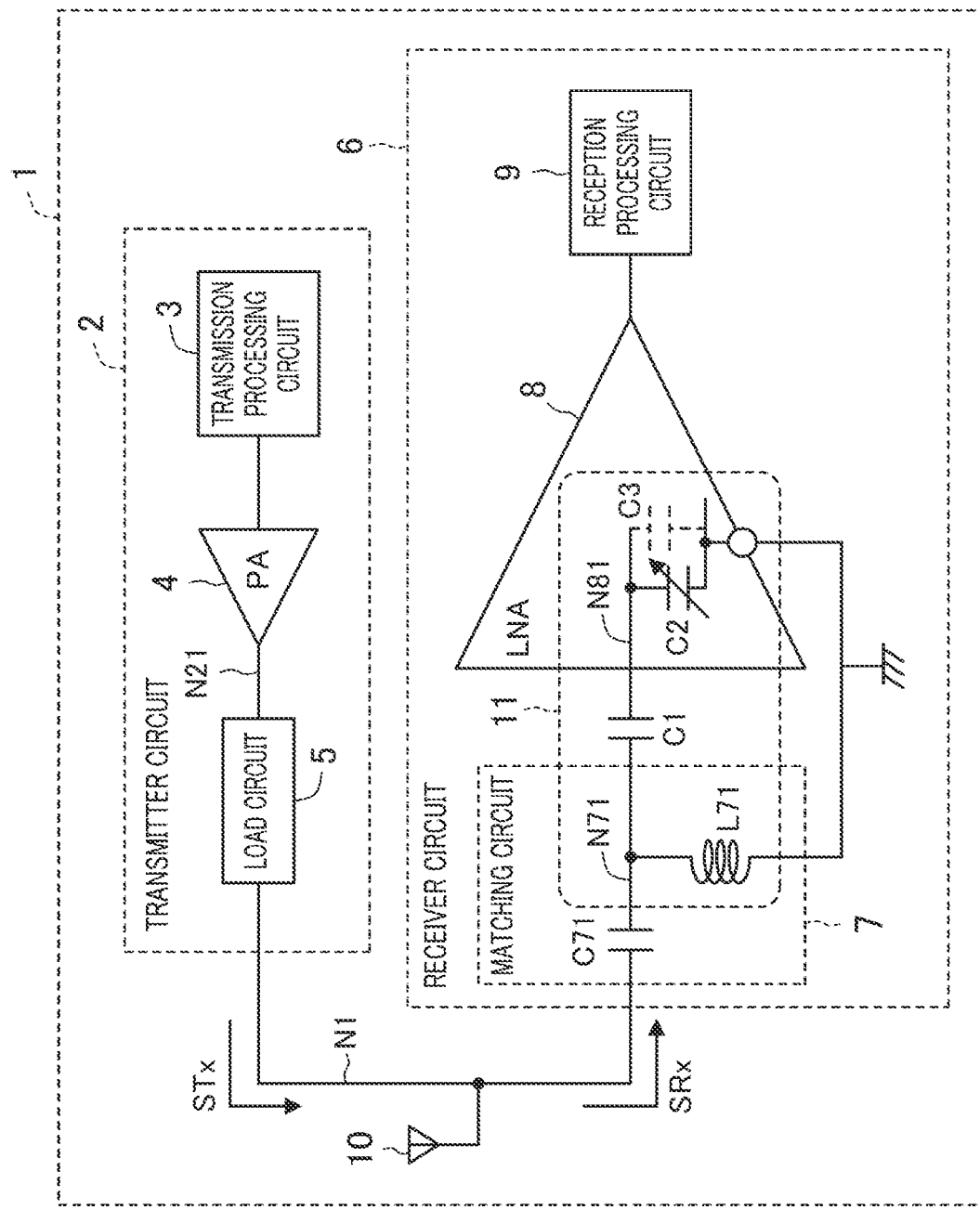
FIG. 1 is a schematic configuration diagram of a wireless communication circuit of an embodiment.

As shown in FIG. 1, a wireless communication circuit 1 includes: an antenna 10 for transmission and reception of a wireless signal; a transmitter circuit 2 that outputs a transmission signal STx to the antenna 10; and a receiver circuit 6 into which a reception signal SRx from the antenna 10 is input. That is, the antenna 10 is connected to both the output of the transmitter circuit 2 and the input of the receiver circuit 6 through a common signal line N1. The receiver circuit 6 includes a matching circuit 7 connected to the antenna 10 and a low noise amplifier (LNA) 8 into which the reception signal is input via the matching circuit 7. In FIG. 1, a transmission processing circuit 3, an output amplifier 4, the LNA 8, and a reception processing circuit 9 are incorporated in an integrated circuit (IC), and the other circuits are mounted outside the IC (e.g., on the board), for example.

The wireless communication circuit 1 according to the present disclosure has a feature that a variable capacitance C2 having a capacitance value changed between the time during which a transmission signal is transmitted from the antenna (hereinafter simply called the "transmission time") and the time during which a reception signal is received by the antenna (hereinafter simply called the "reception time") is provided between the gate and source of an input transistor 81 (see FIG. 4) of the LNA 8 to be described later. More specifically, during the transmission time, the variable capacitance C2 is set at a capacitance value with which the variable capacitance C2 and the matching circuit 7 constitute a parallel resonant circuit 11 parallel-resonating with the frequency of the transmission signal. With this, during the transmission time, the load on the receiver circuit 6 side with respect to the output amplifier 4 of the transmitter circuit 2 to be described later can be relieved. That is, the presence of the variable capacitance C2 works to prevent or reduce attenuation of the transmission signal. On the other hand, during the reception time, the variable capacitance C2 is set so that the capacitance value be substantially 0 (zero). With this, during the reception time, the variable capacitance C2 works not to attenuate the reception signal due to its presence.

Detailed description will be made hereinafter showing specific circuit configuration examples.

(Transmitter Circuit)

As shown in FIG. 1, the transmitter circuit 2 includes the transmission processing circuit 3, the output amplifier 4 that amplifies the output of the transmission processing circuit 3, and a load circuit 5 provided between the output amplifier 4 and the antenna 10.

The transmission processing circuit 3 has all circuits required for transmitting the transmission signal STx to be transmitted from the antenna 10 according to a desired format. The transmission processing circuit 3 is a circuit of which the design is changeable depending on the format and frequency band of the signal to be transmitted as the transmission signal, the relevant specifications of the interface, and the like. Since a conventionally known configuration can be used as its specific circuit configuration, detailed description thereof is omitted here.

The output amplifier 4 is a Class E amplifier, for example. The configuration of the Class E amplifier is not specifically limited, but a wide range of conventionally known circuit configurations can be used. By use of a Class E amplifier as the output amplifier 4, the frequency band of the transmission signal STx can be set or changed with the drive frequency of a switch (not shown) inside the output amplifier 4 and the circuit constant of the load circuit 5.

Figure 3:
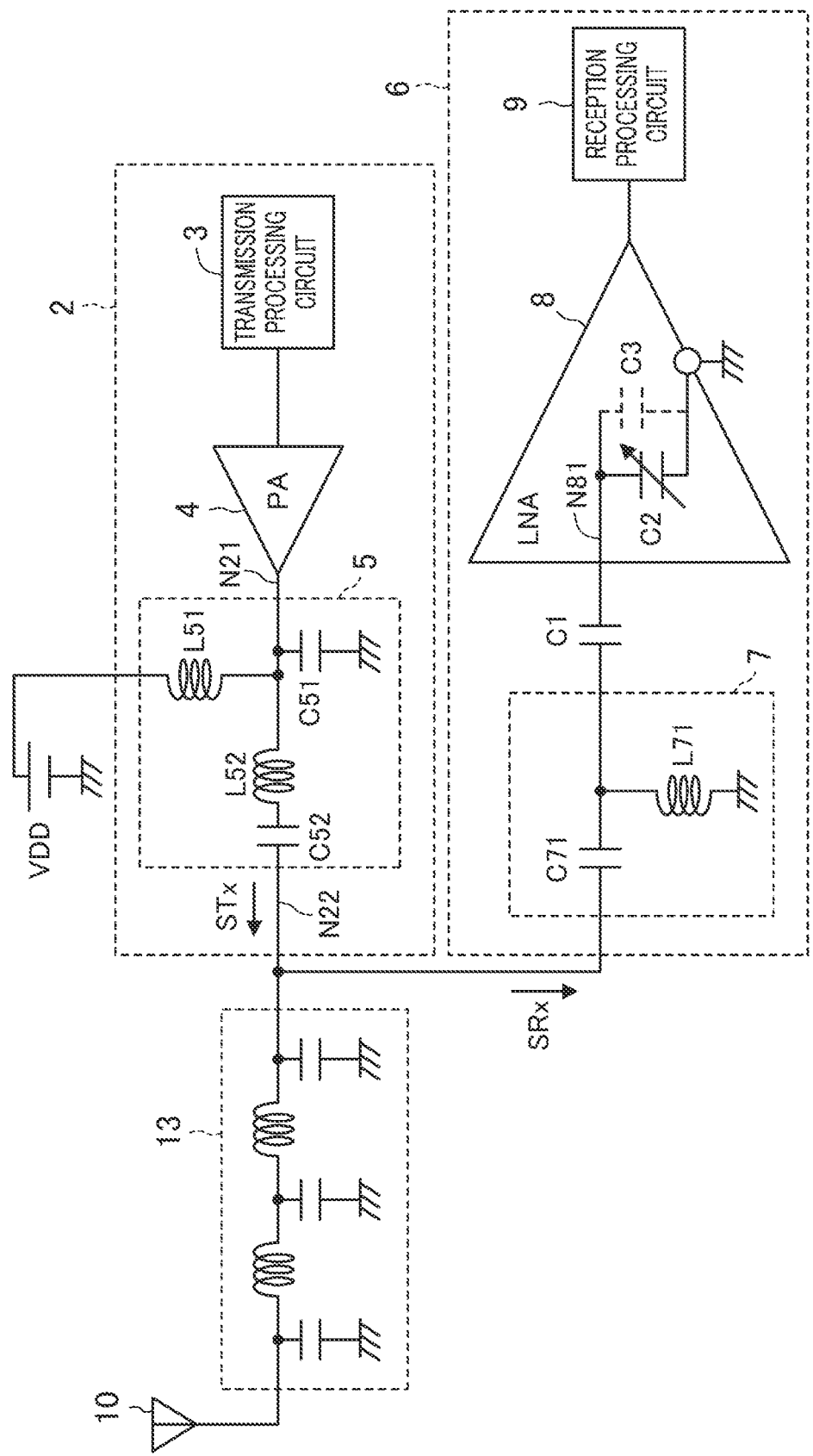
FIG. 3 is a schematic configuration diagram of a wireless communication circuit of an embodiment.

FIG. 3 shows a more detailed configuration example of the wireless communication circuit 1. In the example of FIG. 3, in addition to the configuration of FIG. 1, a harmonic suppressor circuit 13 is provided between the load circuit 5 and the antenna 10. In the following description, the signal line connecting the output amplifier 4 and the load circuit 5 is denoted by N21, and the signal line connecting the load circuit 5 and the harmonic suppressor circuit 13 is denoted by N22.

The load circuit 5 includes load inductors L51 and L52 and load capacitances C51 and C52. The load inductor L51 is provided between the power supply VDD and the signal line N21, and the load capacitance C51 is provided between the signal line N21 and the ground. The load inductor L52 and the load capacitance C52 are serially connected between the signal line N21 and the signal line N22. As described earlier, the frequency band of the transmission signal STx can be set or changed with the circuit constants of the load inductors L51 and L52 and the load capacitances C51 and C52.

Note that an amplifier other than the Class E amplifier (e.g., a linear amplifier) may be used as the output amplifier 4. In this case, the configuration of the load circuit 5 is to be changed to suit to the configuration of the output amplifier 4.

The harmonic suppressor circuit 13, provided between the transmitter and receiver circuits 2 and 6 and the antenna 10, is a circuit for removing components of the transmission signal STx other than its fundamental wave during the transmission time. In FIG. 3, as the harmonic suppressor circuit 13, shown is a configuration example where a 7t-type LC circuit and an L-type LC circuit are combined. Note that any other configuration may be used as the harmonic suppressor circuit 13. Otherwise, the harmonic suppressor circuit 13 may be omitted as shown in FIG. 1.

(Receiver Circuit)

The receiver circuit 6 includes the matching circuit 7, a coupling capacitance C1, the LNA 8, and the reception processing circuit 9.

The matching circuit 7 is a circuit that converts the impedance 50 [Ω] of the antenna 10 into a complex conjugate of the input impedance of the LNA 8, thereby conveying the power of the reception signal SRx to the LNA 8 without waste.

As shown in FIG. 1, the matching circuit 7 includes a capacitance C71 and an inductor L71. The capacitance C71 and the coupling capacitance C1 are serially connected between the signal line N1 and the LNA 8. The inductor L71 is provided between a signal line N71, connecting the capacitance C71 and the coupling capacitance C1, and the ground. With this, the reception signal SRx received at the antenna 10 is input into the LNA 8 via the signal line N1, the capacitance C71, and the coupling capacitance C1. The coupling capacitance C1 is a capacitance for cutting off the DC component of the reception signal SRx.

—LNA Circuit—

Figure 4:
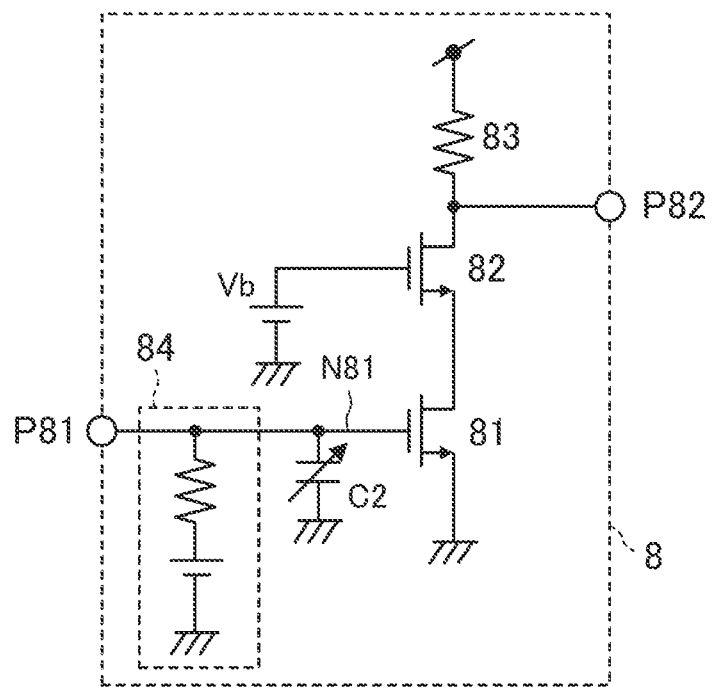
FIG. 4 is a circuit diagram showing a configuration example of an LNA.

FIG. 4 shows a circuit configuration example of the LNA 8.

The LNA 8 includes the MOS input transistor 81 receiving at its gate the reception signal SRx from the antenna 10 via the matching circuit 7.

In the example of FIG. 4, the input transistor 81 is an n-type transistor of which the gate is connected to an input terminal P81 of the LNA 8 and the source is connected to the ground. In the following description, the signal line connecting the input terminal P81 of the LNA 8 and the gate of the input transistor 81 is denoted by N81.

The drain of the input transistor 81 is connected to an output terminal P82 of the LNA 8 via a cascode transistor 82. A resistance 83 is connected between the power supply and the output terminal P82. A bias voltage Vb is fed to the gate of the cascode transistor 82. An input bias circuit 84 including a resistance and a bias power supply connected in series is provided between the signal line N81 and the ground.

In FIGS. 1 and 3, the input capacitance of the input transistor 81 formed between the input terminal P81 and the ground is indicated by broken lines and denoted by C3.

Moreover, the variable capacitance C2 is provided between the gate and source of the input transistor 81. In other words, the variable capacitance C2 is provided to be in parallel with the input capacitance C3 of the input transistor 81 between the input terminal P81 and the ground. The capacitance value of the variable capacitance C2 is changed between the transmission time and the reception time.

<Transmission Time>

As described earlier, during the transmission time, the variable capacitance C2 is set at a capacitance value with which the variable capacitance C2 and the matching circuit 7 constitute a parallel resonant circuit 11 parallel-resonating with the transmission frequency ftx of the transmission signal STx.

Figure 2:
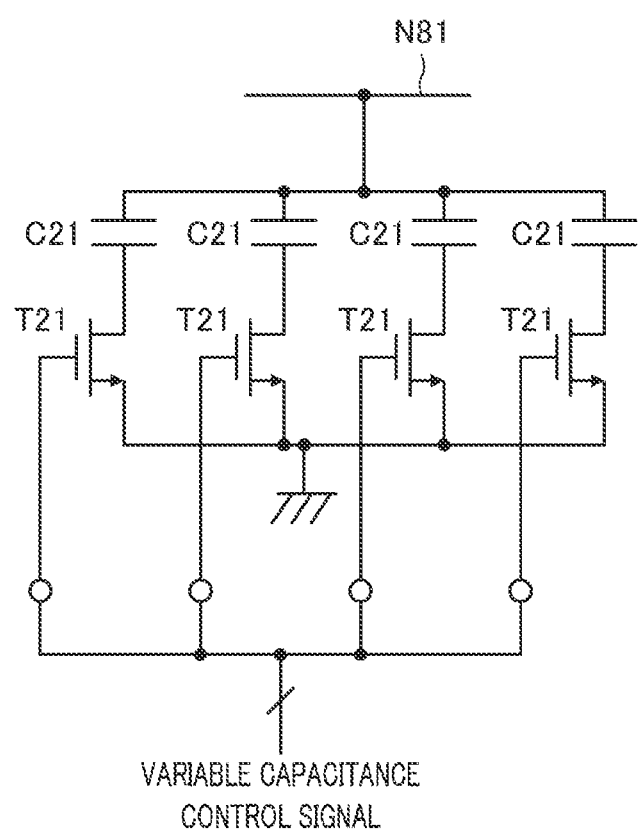
FIG. 2 is a circuit diagram showing a configuration example of a variable capacitance.

FIG. 2 shows a circuit configuration example of the variable capacitance C2. In the example of FIG. 2, a plurality of circuit parts, each including a capacitance C21 and a MOS transistor T21 as a switch connected in series, are connected in parallel between the signal line N81 and the ground. The capacitance value is made to change stepwise by controlling ON/OFF of the MOS transistors T21 with a variable capacitance control signal. With this stepwise change of the capacitance value of the variable capacitance C2, it is possible to respond to various transmission frequencies ftx of the transmission signal STx.

When the resonant frequency of the parallel resonant circuit 11 is set at the transmission frequency ftx, the transmission frequency is expressed by Equation (1) below. Note that in this equation, the capacitance values of the capacitances are denoted by the same characters as the respective capacitances, and the inductance values of the inductors are denoted by the same characters as the respective inductors. For example, C1 in this equation denotes the capacitance value of the coupling capacitance C1.

$$ftx = \frac{1}{2\pi\sqrt{\frac{L1 \cdot C1 \cdot (C2 + C3)}{C1 + C2 + C3}}} \qquad (1)$$

When the capacitance value C1 is sufficiently large with respect to the capacitance values C2 and C3, the capacitance value C2 of the variable capacitance C2 is expressed by Equation (2):

$$C2 = \frac{1}{ftx \cdot (2\pi)^2 \cdot L1} - C3 \qquad (2)$$

By setting the variable capacitance control signal so that the capacitance value C2 expressed by this equation be obtained, it is possible to enhance the input impedance of the LNA, thereby relieving the load on the receiver circuit side. This prevent or reduces the loss of the output load, and therefore the transmission output can be maximized.

Figure 5:
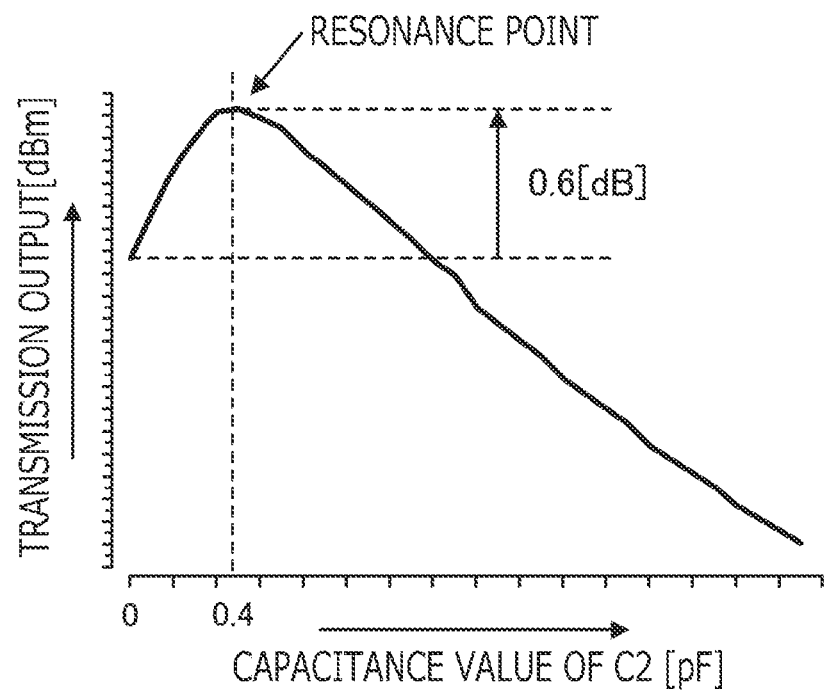
FIG. 5 is a view showing the relationship between the capacitance value of the variable capacitance and the intensity of a transmission signal.

FIG. 5 shows the simulation results where changes of the transmission signal STx to be transmitted from the antenna, obtained by changing the capacitance value of the variable capacitance C2 in the circuit of FIG. 3, are plotted. In FIG. 5, the capacitance value of the variable capacitance C2 is changed under the setting of the transmission frequency at 920 [MHz] and the capacitance value of the coupling capacitance C1 at 1000 [pF].

As shown in FIG. 5, when the capacitance value of the variable capacitance C2 is set at 0.4 [pF] with the variable capacitance control signal, the loss due to the input capacitance C3 of the LNA 8 of the receiver circuit 6 is minimum, and as a result, the transmission output of the transmission signal STx is maximum (see the arrow indicated by "resonance point" in FIG. 5). More specifically, in comparison with the case where the variable capacitance C2 is not provided (the capacitance value of the variable capacitance C2 is 0 (zero)), the transmission output of the transmission signal STx rises by 0.6 [dB].

<Reception Time>

As described earlier, during the reception time, the variable capacitance C2 is set so that the capacitance value becomes substantially 0 (zero). When the variable capacitance C2 is configured as shown in FIG. 2, all the MOS transistors T21 are controlled to be OFF (a LOW signal is applied when the transistors are n-type ones). During the reception time, therefore, the reception signal SRx is prevented from attenuating due to the addition of the variable capacitance C2. Note that, while the capacitance value of the variable capacitance C2 is preferably set at substantially 0 (zero) during the reception time, the capacitance value may otherwise be set at a value smaller than that during the transmission time.

As described above, the wireless communication circuit 1 of this embodiment includes: the antenna 10; the transmitter circuit 2 having the output amplifier 4 outputting the transmission signal STx to the antenna 10; the receiver circuit 6 having the LNA 8 into which the reception signal SRx from the antenna 10 is input; and the matching circuit 7 provided between the antenna 10 and the input of the LNA 8. The LNA 8 has the MOS input transistor 81 receiving at its gate the reception signal SRx from the antenna 10 via the matching circuit 7, and includes the variable capacitance C2 provided between the gate and source of the input transistor 81, of which the capacitance value is changed between the transmission time during which the transmission signal STx is output and the reception time during which the reception signal is received.

Preferably, the variable capacitance C2 is set at a larger capacitance value during the transmission time than during the reception time. More preferably, the variable capacitance C2 is set at a capacitance value with which the variable capacitance C2 and the matching circuit 7 constitute the parallel resonant circuit 11 parallel-resonating with the transmission frequency ftx of the transmission signal STx during the transmission time, and set at a capacitance value substantially 0 (zero) during the reception time.

By the above setting, it is possible to enhance the input impedance of the LNA thereby relieving the load on the receiver circuit 6 side with respect to the output amplifier 4 of the transmitter circuit 2 during the transmission time, and prevent attenuation of the reception signal SRx during the reception time, without the need of providing a switch or a strip line like the one described in the prior art between the transmitter circuit and the receiver circuit. In other words, attenuation of the transmission signal STx and the reception signal SRx can be prevented or reduced even when the transmitter circuit 2 and the receiver circuit 6 are connected through the common signal line N1 with no switch or strip line on the route from the antenna 10. That is, desired properties can be achieved with no switch or strip line provided and with a smaller number of circuit elements than in the case of providing a switch or a strip line.

The wireless communication circuit according to the present disclosure is very useful because it can prevent or reduce attenuation of the transmission signal and the reception signal with no switch or strip line provided.

What is claimed is:

1. A wireless communication circuit, comprising:
   an antenna;
   a transmitter circuit having an output amplifier outputting a transmission signal to the antenna;
   a receiver circuit having a low noise amplifier (LNA) into which a reception signal from the antenna is input; and
   a matching circuit provided between the antenna and an input of the LNA,
   wherein
   the LNA has a MOS input transistor receiving at its gate the reception signal from the antenna via the matching circuit, and
   the LNA includes a variable capacitance provided between the gate and a source of the input transistor, a capacitance value of the variable capacitance being changed between a transmission time during which the transmission signal is output and a reception time during which the reception signal is received.

2. The wireless communication circuit of claim 1, wherein the capacitance value of the variable capacitance is set at zero during the reception time.

3. The wireless communication circuit of claim 1, wherein the capacitance value of the variable capacitance is changed according to a transmission frequency of the transmission signal during the transmission time.

4. The wireless communication circuit of claim 1, wherein the variable capacitance includes a circuit having a plurality of serial circuits connected in parallel, each of the serial circuits including a capacitance and a switch connected in series.

* * * * *